United States Patent
Palanduz

(10) Patent No.: US 7,504,271 B2
(45) Date of Patent: Mar. 17, 2009

(54) INTEGRATED CIRCUIT PACKAGE SUBSTRATE HAVING A THIN FILM CAPACITOR STRUCTURE

(75) Inventor: Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 255 days.

(21) Appl. No.: 11/494,354

(22) Filed: Jul. 26, 2006

(65) Prior Publication Data

US 2006/0270111 A1   Nov. 30, 2006

Related U.S. Application Data

(62) Division of application No. 10/746,665, filed on Dec. 23, 2003, now Pat. No. 7,132,743.

(51) Int. Cl.
*H01L 21/58* (2006.01)
(52) U.S. Cl. .................. 438/25; 438/26; 438/108; 438/118; 257/E21.511
(58) Field of Classification Search ............ 438/25, 438/26, 108, 118; 257/E21.511
See application file for complete search history.

(56) References Cited

U.S. PATENT DOCUMENTS

| | | | | |
|---|---|---|---|---|
| 4,313,026 A | * | 1/1982 | Yamada et al. | 174/256 |
| 4,681,656 A | * | 7/1987 | Byrum | 216/65 |
| 5,011,725 A | * | 4/1991 | Foster | 428/137 |
| 5,324,570 A | * | 6/1994 | Ommen et al. | 428/209 |
| 5,614,043 A | * | 3/1997 | Ritland et al. | 156/89.18 |
| 6,016,005 A | * | 1/2000 | Cellarosi | 257/703 |

(Continued)

FOREIGN PATENT DOCUMENTS

EP   0 359 513 A2   3/1990

(Continued)

OTHER PUBLICATIONS

PCT International Search Report, International Application No. PCT/US2004/042753, filing date Dec. 17, 2004, mailed on Jul. 4, 2005 (6 pages).

(Continued)

*Primary Examiner*—George Fourson
(74) *Attorney, Agent, or Firm*—Blakely, Sokoloff, Taylor & Zafman LLP

(57) ABSTRACT

This invention relates to the manufacture of a substrate, such as a package substrate or an interposer substrate, of an integrated circuit package. A base structure is formed from a green material having a plurality of via openings therein. The green material is then sintered so that the green material becomes a sintered ceramic material and the base structure becomes a sintered ceramic base structure having the via openings. A conductive via is formed in each via opening of the sintered ceramic base structure. A capacitor structure is formed on the sintered ceramic base structure. The power and ground planes of the capacitor structure are connected to the vias. As such, a capacitor structure can be formed and connected to the vias without the need to drill vias openings in brittle substrates such as silicon substrates. The sintered ceramic material also has a low coefficient of thermal expansion and can resist high temperature processing conditions when manufacturing the capacitor structure, and is inexpensive to manufacture.

5 Claims, 4 Drawing Sheets

U.S. PATENT DOCUMENTS

| | | | |
|---|---|---|---|
| 6,072,690 A * | 6/2000 | Farooq et al. | 361/321.2 |
| 6,143,421 A * | 11/2000 | Ritland et al. | 428/545 |
| 6,270,601 B1 * | 8/2001 | Ritland et al. | 156/89.12 |
| 6,407,929 B1 | 6/2002 | Hale et al. | |
| 6,430,058 B1 | 8/2002 | Sankman et al. | |
| 6,430,059 B1 | 8/2002 | Hung et al. | |
| 6,611,419 B1 | 8/2003 | Chakravorty | |
| 6,791,133 B2 | 9/2004 | Farooq et al. | |
| 6,852,436 B2 * | 2/2005 | Badding et al. | 429/32 |
| 6,970,362 B1 | 11/2005 | Chakravorty | |

FOREIGN PATENT DOCUMENTS

| | | |
|---|---|---|
| EP | 0 526 707 A1 | 2/1993 |
| WO | WO 02/11206 A2 | 2/2002 |

OTHER PUBLICATIONS

Office Action from U.S. Appl. No. 10/746,665, mailed Jan. 10, 2006, 12 pgs.

* cited by examiner

_US 7,504,271 B2_

INTEGRATED CIRCUIT PACKAGE SUBSTRATE HAVING A THIN FILM CAPACITOR STRUCTURE

CROSS-REFERENCE TO RELATED APPLICATIONS

This is a divisional of prior U.S. patent application Ser. No. 10/746,665, filed on Dec. 23, 2003 now U.S. Pat. No. 7,132,743.

This application is related to U.S. patent application Ser. No. 10/803,789 entitled "INTEGRATED CIRCUIT PACKAGE SUBSTRATE HAVING A THIN FILM CAPACITOR STRUCTURE," by Palanduz, et al., filed on Mar. 17, 2004 now U.S. Pat. No. 7,099,139, which is hereby incorporated herein by reference.

BACKGROUND OF THE INVENTION

1). Field of the Invention

This invention relates to a capacitor structure that is included in a substrate of an integrated circuit package.

2). Discussion of Related Art

Integrated circuits are usually manufactured on wafer substrates. Wafer substrate is then "diced" or "singulated" into individual dies, each die carrying a respective integrated circuit. The die is then mounted on a package substrate, often with an intermediate interposer substrate. The substrate or substrates provide structural rigidity to the resulting integrated circuit package. A package substrate also provides x-y transformation from contacts of the die to contacts on a carrier substrate on which the integrated circuit package is mounted.

Signals can be provided through conductors in the substrate or substrates to and from an integrated circuit in the die. Signal delay, referred to as resistance-capacitance-inductance delay, often occurs when signals are transmitted through the conductors. In order to reduce resistance-capacitance-inductance delay, a capacitor is often provided close to the die. The capacitor acts as a reservoir of power close to the integrated circuit.

Discrete capacitors are relatively large and thus take up a large amount of real estate on a substrate. It has been appreciated that thin film capacitors may take up less real estate, which will allow for more capacitors to be formed. It may also be simpler to manufacture thin film capacitors during the manufacture of a substrate than to mount discrete capacitors to a substrate.

Via openings have to be manufactured in a base structure of a substrate, in which conductive vias have to be formed to which power and ground planes of a thin film capacitor structure have to be connected. The formation of such via openings has been a preoccupation of the semiconductor industry for a number of years. Thus far, all efforts have been directed to drilling openings in low k-value materials such as silicon. Silicon is a brittle material, which makes it difficult to drill openings therein. Each opening also has to be drilled individually, which reduces throughput.

BRIEF DESCRIPTION OF THE DRAWINGS

The invention is described by way of examples with reference to the accompanying drawings wherein.

DETAILED DESCRIPTION OF THE INVENTION

The manufacture of a substrate, such as a package substrate or an interposer substrate, of an integrated circuit package is described. A base structure is formed from a green material having a plurality of via openings therein. The green material is then sintered so that the green material becomes a sintered ceramic material and the base structure becomes a sintered ceramic base structure having the via openings. A conductive via is formed in each via opening of the sintered ceramic base structure. A capacitor structure is formed on the sintered ceramic base structure. The power and ground planes of the capacitor structure are connected to the vias. As such, a capacitor structure can be formed and connected to the vias without the need to drill via openings in brittle substrates such as silicon substrates. The sintered ceramic material also has a low coefficient of thermal expansion and can resist high temperature processing conditions when manufacturing the capacitor structure, and is inexpensive to manufacture.

Figure 1:
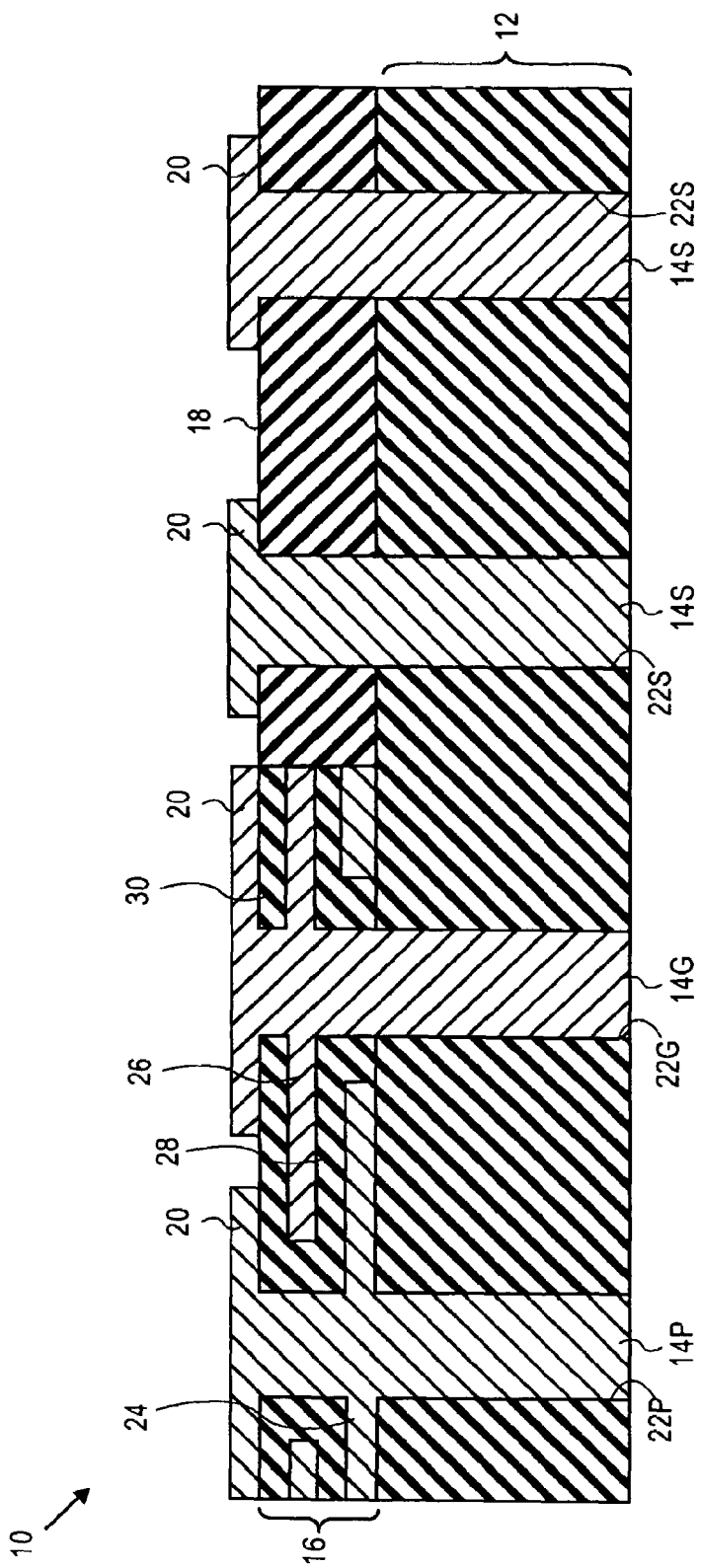
FIG. 1 is a cross-sectional side view of an interposer substrate manufactured according to an embodiment of the invention.

FIG. 1 of the accompanying drawings illustrates an interposer substrate 10 which has been constructed according to a method of an embodiment of the invention. The interposer substrate 10 includes a base structure 12, conductive vias 14, a capacitor structure 16 having a high k-value dielectric material, a low k-value dielectric material 18, and contact pads 20.

The base structure 12 is initially made from a green, unsintered material. The green material is package in the shape of the base structure 12 and via openings 22 are then punched through the green material. Handling, packaging and punching of green material is known in the art. An advantage of punching holes in a green material is that the green material is not as brittle as other substrates such as silicon substrates. The green material is subsequently sintered so that the green material becomes a sintered ceramic material and the base structure 12 becomes a sintered ceramic base structure 12. The sintered ceramic base structure 12 then has the via openings 22. The via openings 22 include a power via opening 22P, a ground via opening 22G, and signal via openings 22S. Each one of the via openings 22 extends from a lower surface through an upper surface of the horizontal sintered ceramic base structure 12.

The low k-value dielectric material 18 is then formed over the entire upper surface of the sintered ceramic base structure 12. The low k-value dielectric material 18 thus covers the power, ground and signal via openings 22P, 22G and 22S. The low k-value dielectric material 18 is typically made of silicon dioxide, which has a dielectric constant of between three and four.

The low k-value dielectric material 18 is subsequently patterned. The low k-value dielectric material 18 may for example be patterned by first covering a portion thereof and then burning exposed portions away. The portions that are burned away (or etched) are portions thereof located over the power and ground via openings 22P and 22G. Openings are also burned (or etched) in the low k-value dielectric material 18 so that the signal via openings 22S extend vertically through the low k-value dielectric material 18.

The capacitor structure 16 is then formed on the sintered ceramic base structure 12 where the low k-value dielectric material 18 has been burned away (or etched). That is, the capacitor structure 16 is formed on an area of the upper surface of the sintered ceramic base structure 12 that has the power and ground via openings 22P and 22G. The capacitor structure 16 includes power and ground planes 24 and 26 and a dielectric layer 28. The power and ground planes are typically made of copper or platinum. The dielectric layer 28 is made of a high k-value dielectric material which may have a dielectric constant of between 300 and 900, although the dielectric constant may be as high as 3000. An insulating layer 30 is formed on top of the ground plane 26 in order to add a second capacitance and is made of the same material as the dielectric layer 28. More layers could be added for extra capacitance. The layers and planes 24, 26, 28 and 30 are all patterned so that the power and ground via openings 22P and 22G extend vertically through the entire capacitor structure 16. The manufacture of thin film capacitor structures such as the capacitor structure 16 is known in the art.

The via openings 22 are all subsequently filled with the conductive vias 14. The conductive vias 14 are typically formed from a conductive metal such as copper, silver or an alloy of tungsten and molybdenum. The conductive vias may for example be sputter-deposited, plated or printed, within the via openings 22. The conductive vias 14 include power, ground and signal conductive vias 14P, 14G and 14S in the power, ground and signal via openings 22P, 22G and 22S, respectively. The power conductive via 14P is in contact with the power plane 24 and is not connected to the ground plane 26. The ground conductive via 14G is in contact with the ground plane 26 and is not connected to the power plane 24. Each signal conductive via 14S is electrically disconnected from all other conductive vias 14P, 14G and 14S.

The contact pads 20 are then formed on the capacitor structure 16 and the low k-value dielectric material 18. Each contact pad 20 is located on and electrically connected to a respective one of the conductive vias 14.

Figure 2:
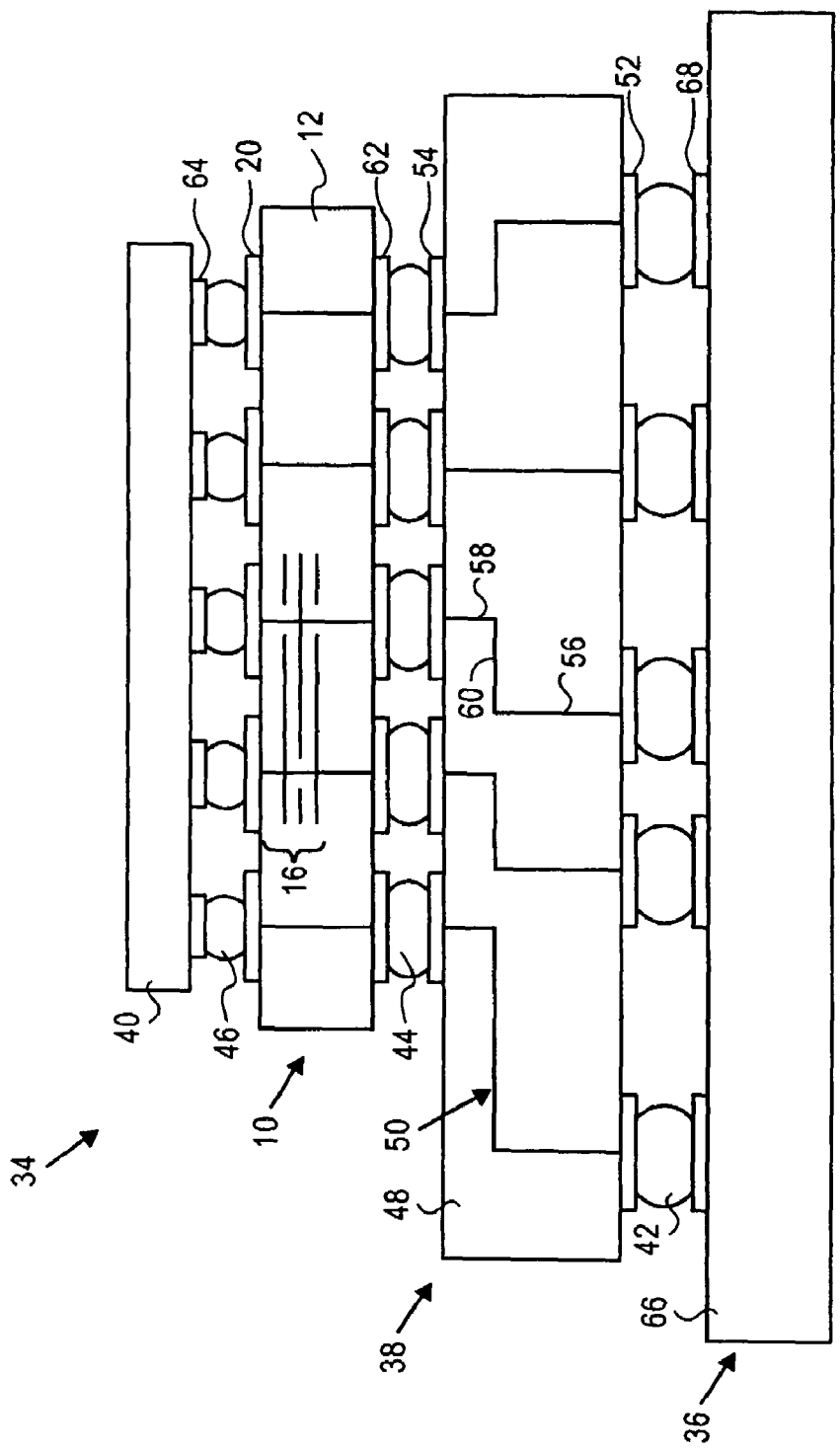
FIG. 2 is a cross-sectional side view of an integrated circuit package which includes the interposer substrate of FIG. 1.

FIG. 2 illustrates the interposer substrate 10 within an integrated circuit package 34 according to an embodiment of the invention. The integrated circuit package 34 further includes a carrier substrate 36, a package substrate 38, a die 40 and respective sets of conductive interconnection members 42, 44, and 46.

The package substrate 38 has a base structure 48, a plurality of conductive lines 50 within the base structure 48, a plurality of contact pads 52 on a lower surface of base structure 48, and a plurality of contact pads 54 on an upper surface of base structure 48. The base structure 48 is made of a low k-value dielectric material. In the given example, each one of the conductive lines 50 interconnects a respective one of the contact pads 52 with a respective one of the contact pads 54. Some of the conductive lines 50 have two vertical vias 56 and 58 that are interconnected by a horizontal line 60. The inclusion of the horizontal line 60 allows for the contact pads 54 to be offset with respect to the contact pads 52. The conductive lines 50 thus allow for an x-y transformation from the contact pads 52 to the contact pads 54.

As illustrated, the interposer substrate 10 further has a plurality of contact pads 62 on a lower surface of a sintered ceramic base structure 12. There is no x-y transformation from the contact pads 62 at the lower side of the interposer substrate 10 to the contact pads 20 at the upper side of the interposer substrate 10. Each one of the contact pads 62 matches up with a respective one of the contact pads 54 and a respective one of the conductive interconnection members 44 interconnects a respective one of the contact pads 62 with a respective one of the contact pads 54.

The die 40 has an integrated circuit formed in a lower surface thereof. A plurality of contact pads 64 are formed on a lower surface of the die 40 and are electrically connected to the integrated circuit. Each one of the contact pads 64 matches up with a respective one of the contact pads 20 and is connected thereto by a respective one of the conductive interconnection members 46. It can thus be seen that there is no x-y transformation from the contact pads 64 to the contact pads 54 and that there is an x-y transformation from the contact pads 54 to the contact pads 52.

The carrier substrate 36 has a respective base structure 66 and a plurality of contact pads 68 formed on an upper surface of the base structure 66. Each one of the contact pads 52 is aligned with a respective one of the contact pads 68 and is connected thereto by a respective one of the conductive interconnection members 42.

Figure 3:
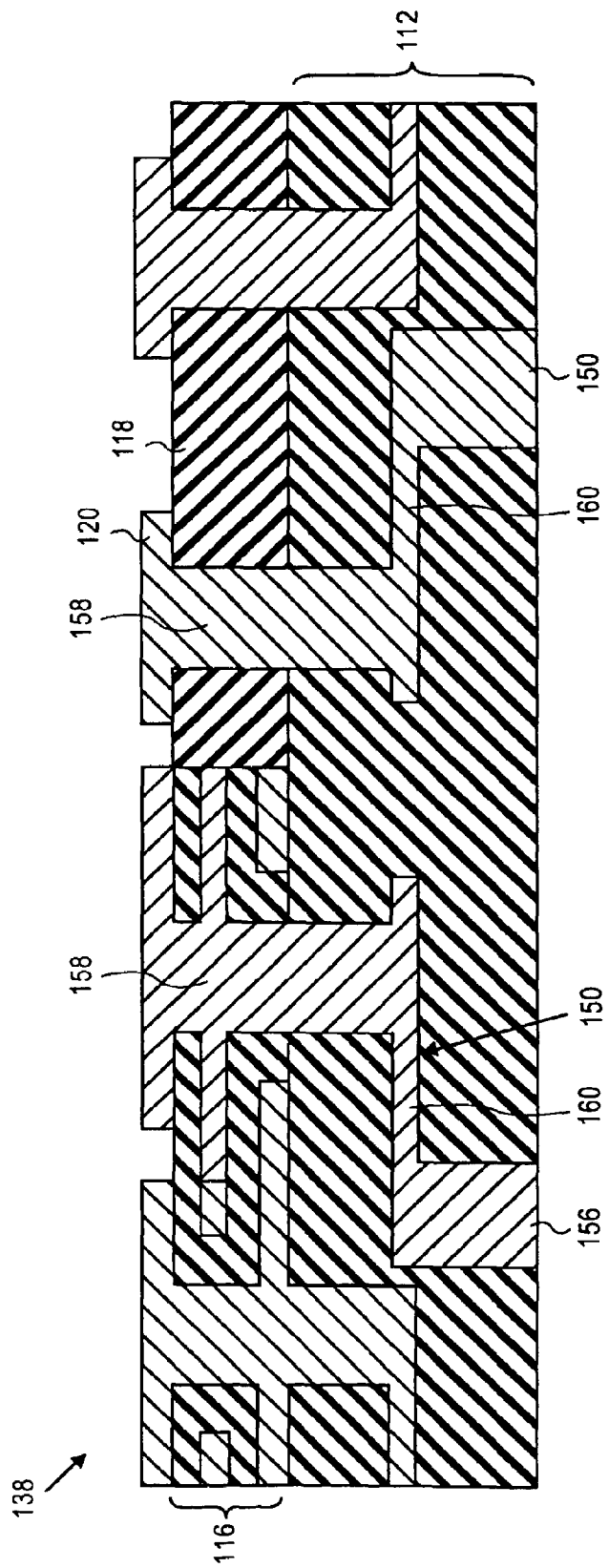
FIG. 3 is a cross-sectional side view of a package substrate manufactured according to an embodiment of the invention.

FIG. 3 illustrates a package substrate 138 which is manufactured according to a method of another embodiment of the invention. The package substrate 138 includes a sintered ceramic base structure 112, a capacitor structure 116, a low k-value dielectric material 118, and contact pads 120 that are the same as the sintered ceramic base structure 12, capacitor structure 16, and contact pads 20 of the interposer substrate 10 of FIG. 1. The package substrate 138 differs from the interposer substrate 10 in that conductive lines 150 are provided instead of the conductive vias 14.

Each one of the conductive lines includes two vertical vias 156 and 158 and a horizontal line 160 interconnecting the vertical vias 156 and 158. The sintered ceramic base structure 112 is formed in stages so that the horizontal line 160 is buried below an upper surface of the sintered ceramic base structure 112. The horizontal line 160 allows for the vertical vias 156 and 158 to be horizontally offset with respect to one another. The horizontal lines 160 thus allow for x-y transformation on the vertical vias 156 to the vertical vias 158.

Figure 4:
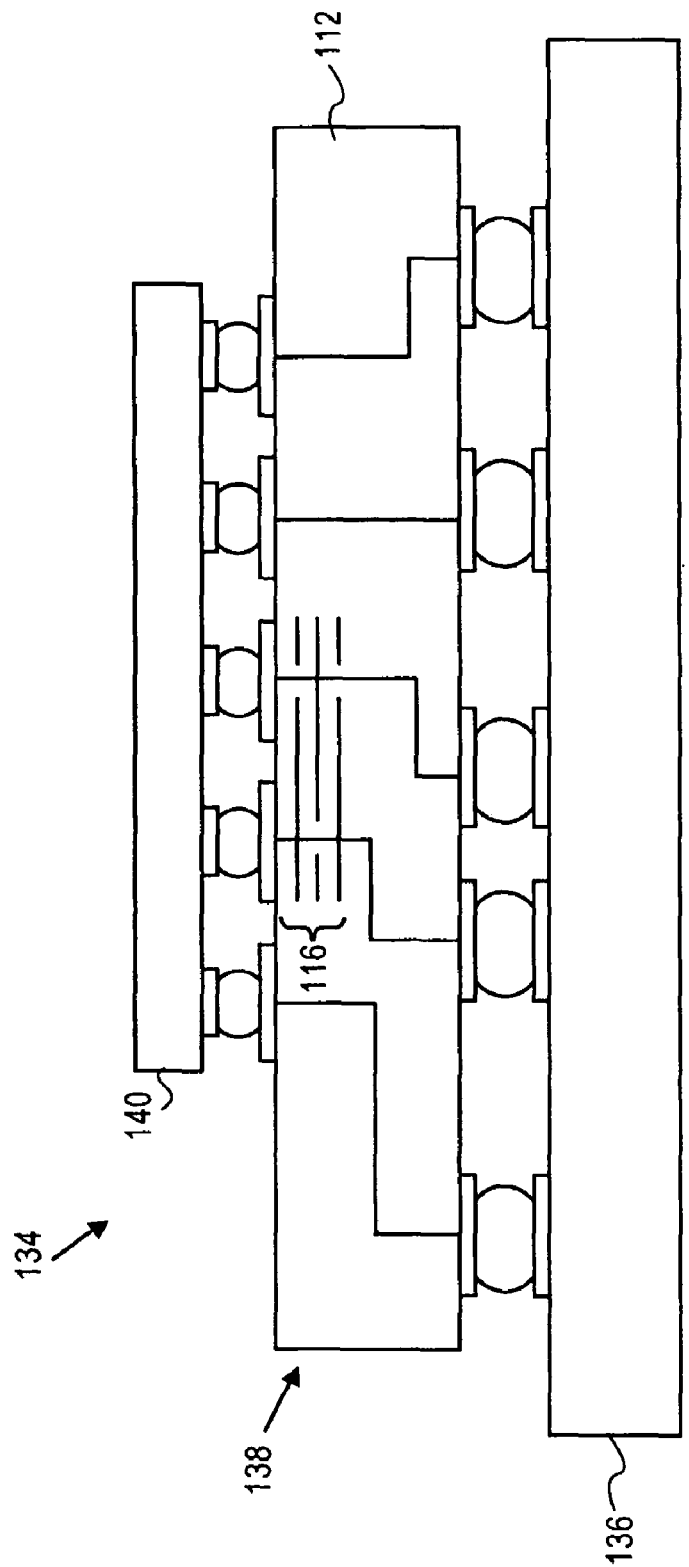
FIG. 4 is a cross-sectional side view of an integrated circuit package that includes the package substrate of FIG. 3.

FIG. 4 illustrates an integrated circuit package which includes the package substrate 138, a carrier substrate 136 and a die 140. The die 140 and carrier substrate 136 are the same as the die 40 and carrier substrate 36 of the integrated circuit package 34 of FIG. 2. The integrated circuit package 134 differs from the integrated circuit package 34 in that there is no intermediate interposer substrate between the die 140 and the package substrate 138. In the integrated circuit package 34 of FIG. 2, the interposer substrate 10 provides a capacitor structure 16 close to the die 40 and the package substrate 38 provides an x-y transformation. In the integrated circuit package 134 of FIG. 4, by contrast, the package substrate 138 provides a capacitor structure 116 close to the die 140 and provides x-y transformation.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of constructing at least a portion of an integrated circuit package, comprising:

forming a base structure, of a green material, having a plurality of via openings therein;

sintering the green material so that the green material becomes a sintered ceramic material and the base structure becomes a sintered ceramic base structure having the via openings;

forming a low k-value dielectric material on the sintered ceramic base structure and having a plurality of openings therein;

forming a conductive via in each via opening of the sintered ceramic base structure, the conductive vias including at least power, ground vias, and signal vias, each signal via extending through a respective opening in the low k-value dielectric material; and forming a capacitor structure on the sintered ceramic base structure next to the low k-value dielectric material, the capacitor structure including conductive power and ground planes and a high k-value dielectric layer between the power and ground planes, the power and ground planes being electrically connected to at least one of the power vias and one of the ground vias, respectively.

2. The method of claim 1 wherein the vias include signal vias, each signal via being electrically disconnected from both the power and ground planes.

3. The method of claim 2 wherein the at least a portion of integrated circuit package comprises an interposer substrate having first and second portions, the first portion having the high k-value dielectric material and the second portion not having the high k-value dielectric material, the signal vias being formed in the second portion.

4. The method of claim 1 further comprising: mounting the base structure with the capacitor structure thereon, jointly forming an interposer substrate, on a package substrate; and mounting a die having a microelectronic circuit formed therein to the interposer substrate.

5. The method of claim 4 further comprising: forming a plurality of conductive members on the package substrate for interconnection with a carrier substrate.

* * * * *